United States Patent
Sugisawa et al.

(10) Patent No.: US 10,951,020 B2
(45) Date of Patent: Mar. 16, 2021

(54) POWER SUPPLY CONTROL DEVICE HAVING A CONTROL UNIT FOR ESTIMATING A SMOKING TEMPERATURE OF A SWITCH ELEMENT

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Yuuki Sugisawa, Mie (JP); Shunichi Sawano, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 247 days.

(21) Appl. No.: 15/775,665

(22) PCT Filed: Nov. 30, 2016

(86) PCT No.: PCT/JP2016/085528
§ 371 (c)(1),
(2) Date: May 11, 2018

(87) PCT Pub. No.: WO2017/094766
PCT Pub. Date: Jun. 8, 2017

(65) Prior Publication Data
US 2018/0351346 A1 Dec. 6, 2018

(30) Foreign Application Priority Data

Dec. 3, 2015 (JP) .............................. JP2015-236931

(51) Int. Cl.
*H02H 5/04* (2006.01)
*H02H 6/00* (2006.01)
(Continued)

(52) U.S. Cl.
CPC .......... *H02H 5/047* (2013.01); *H02H 1/0007* (2013.01); *H02H 6/00* (2013.01); *H02H 7/22* (2013.01); *H03K 17/0822* (2013.01)

(58) Field of Classification Search
CPC ........ H02H 5/047; H02H 1/0007; H02H 6/00; H02H 7/22; H03K 17/0822
See application file for complete search history.

(56) References Cited

U.S. PATENT DOCUMENTS 5,898,557 A * 4/1999 Baba .................. H03K 17/0822
361/100
2012/0081825 A1 4/2012 Nakamura et al.
(Continued)

FOREIGN PATENT DOCUMENTS

JP 2010-158108 A 7/2010
JP 2014-054115 3/2014
JP 2014-204575 10/2014

OTHER PUBLICATIONS

Search Report for PCT/JP2016/085528, dated Feb. 7, 2017.

*Primary Examiner* — Fred E Finch, III
*Assistant Examiner* — Kevin H Sprenger
(74) *Attorney, Agent, or Firm* — Honigman LLP

(57) ABSTRACT

A power supply control device prevents an electrical wire and a switch element from smoking. The power supply control device includes a switch element provided at a midpoint in an electrical wire that connects a power supply and a load. A current detection unit detects the current value of current flowing in the electrical wire. A temperature estimation unit estimates the wire temperature of the electrical wire based on the current value detected by the current detection unit. A control unit turns on or off the switch element based on the wire temperature estimated. The control unit estimates the smoking temperature of the switch element by changing the heat dissipation time constant of (Continued)

the electrical wire used in temperature calculation to a smaller value, and turns off the switch element if the wire temperature is greater than or equal to the estimated smoking temperature of the switch element.

3 Claims, 3 Drawing Sheets

(51) Int. Cl.
*H03K 17/082* (2006.01)
*H02H 7/22* (2006.01)
*H02H 1/00* (2006.01)

(56) References Cited

U.S. PATENT DOCUMENTS

| | | | |
|---|---|---|---|
| 2015/0057822 A1* | 2/2015 | Baldridge | H03K 17/691 700/293 |
| 2019/0165564 A1* | 5/2019 | Fuseya | B60R 16/03 |
| 2020/0328586 A1* | 10/2020 | Eriksen | H02H 1/0092 |

* cited by examiner

POWER SUPPLY CONTROL DEVICE HAVING A CONTROL UNIT FOR ESTIMATING A SMOKING TEMPERATURE OF A SWITCH ELEMENT

CROSS-REFERENCE TO RELATED APPLICATIONS

This application is the U.S. national stage of PCT/JP2016/085528 filed Nov. 30, 2016, which claims priority of Japanese Patent Application No. JP 2015-236931 filed Mar. 12, 2015.

FIELD OF THE INVENTION

The present disclosure relates to a power supply control device that estimates an electrical wire temperature and cuts off the supply of power to the electrical wire if the estimated wire temperature is greater than or equal to a threshold value.

BACKGROUND OF THE INVENTION

Conventionally, a power supply control device has been proposed that controls the supply of power from a power supply to a load by turning on or off a switch element provided at a midpoint in an electrical wire that connects the power supply and the load (e.g., see JP 2010-239835A).

A signal that instructs the start or end of the supply of power to the load, for example, is input to the power supply control device disclosed in Patent Document JP 2010-239835A. The power supply control device disclosed in Patent Document JP 2010-239835A turns on or off the switch element in accordance with the signal input thereto, and also calculates a temperature difference between the wire ambient temperature and the wire temperature over time based on the value of current flowing through the electrical wire.

This temperature difference is calculated based on a preceding temperature difference that was previously calculated and the value of current flowing through the electrical wire. If the wire temperature, which is calculated by adding the calculated temperature difference to the ambient temperature, is greater than or equal to a predetermined temperature threshold value, the switch element is turned off regardless of the input signal. The supply of power via the electrical wire therefore stops, and the wire temperature decreases, thus preventing the electrical wire from smoking or igniting.

SUMMARY OF THE INVENTION

However, in Patent Document JP 2010-239835A, no consideration whatsoever is given to the smoking characteristic of the switch element. The switch element and the electrical wire have different thermal characteristics (heat generation characteristic and heat dissipation characteristic), and therefore there is a problem that even if the switch element is switched on/off in accordance with an allowable temperature that is set based on only the smoking characteristic of the electrical wire, there is a possibility of not being able to protect the switch element if a relatively large current flows therein.

The present disclosure was achieved in light of the foregoing circumstances, and an object of the present disclosure is to provide a power supply control device that can prevent an electrical wire and a switch element from smoking.

A power supply control device according to the present application is a power supply control device including a switch element provided at a midpoint in an electrical wire that connects a power supply and a load, a current detection unit that detects a current value of a current flowing in the electrical wire, a temperature estimation unit that estimates a wire temperature of the electrical wire based on the current value detected by the current detection unit, and a control unit that performs control to turn on or off the switch element based on the wire temperature estimated by the temperature estimation unit, wherein the control unit estimates a smoking temperature of the switch element by changing a heat dissipation time constant of the electrical wire used in temperature calculation to a smaller value, and performs control to turn off the switch element if the wire temperature is greater than or equal to the estimated smoking temperature of the switch element.

In the power supply control device of the present application, the temperature estimation unit may estimate the wire temperature of the electrical wire based on a thermal resistance, a conductor resistance, the heat dissipation time constant, and the current value of the electrical wire.

In the power supply control device of the present application, the smoking temperature may be a temperature estimated by a smoking characteristic of a virtual electrical wire that has a heat dissipation time constant smaller than the heat dissipation time constant of the electrical wire and that satisfies a smoking characteristic of the switch element.

ADVANTAGEOUS EFFECTS OF DISCLOSURE

According to the present disclosure, it is possible to prevent an electrical wire and a switch element from smoking.

DETAILED DESCRIPTION OF THE PREFERRED EMBODIMENTS

Hereinafter, the present disclosure will be described in detail based on diagrams showing an embodiment of the present disclosure.

Figure 1:
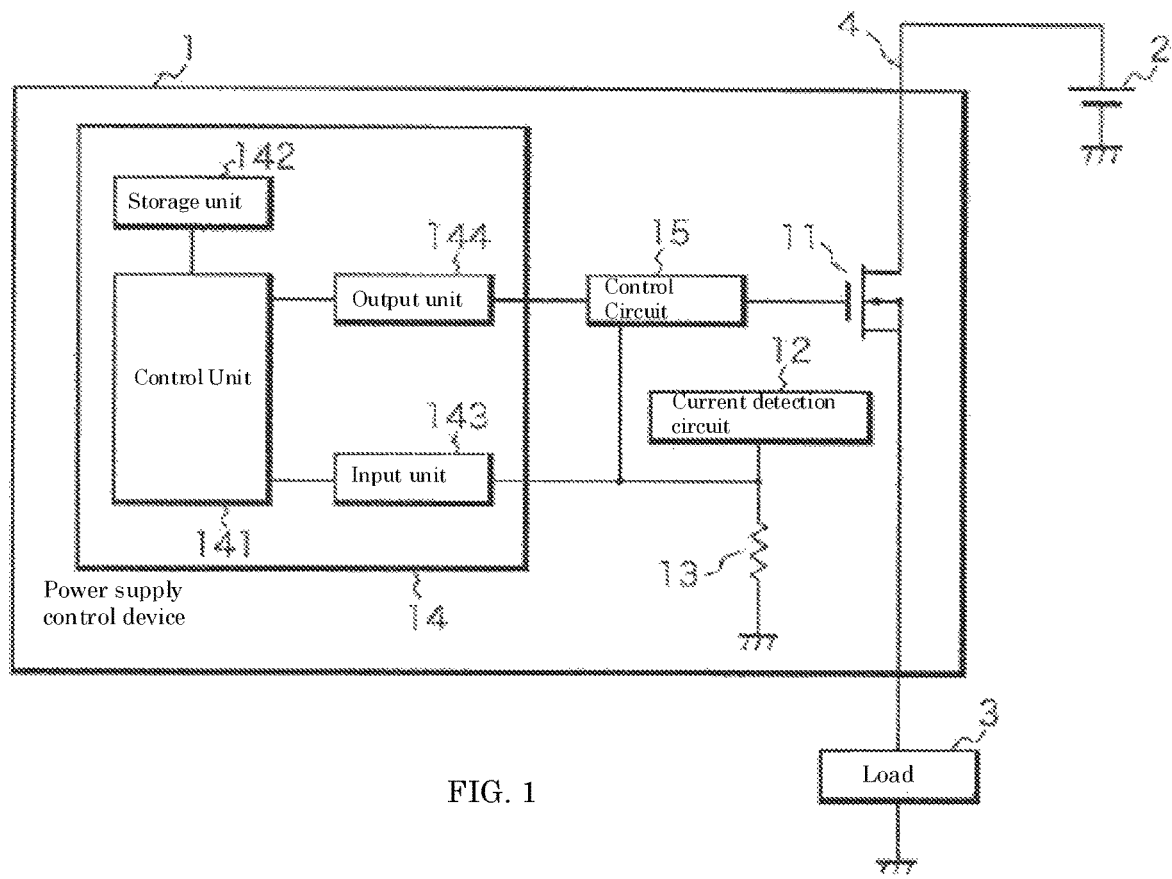
FIG. 1 is a block diagram illustrating a configuration of a power supply control device according to an embodiment.

FIG. 1 is a block diagram illustrating the configuration of a power supply control device according to the present embodiment. A power supply control device 1 according to the present embodiment includes a switch element 11 that is provided at a midpoint in an electrical wire 4 that connects a power supply 2 and a load 3, a current detection circuit 12 that detects the current value of current flowing in the electrical wire 4, a microcomputer 14 that estimates a wire temperature based on the current value detected by the current detection circuit 12, and outputs a control signal for turning the switch element on or off, and a control circuit 15 that turns the switch element on or off in accordance with the control signal from the microcomputer 14.

The power supply control device 1 according to the present embodiment is for installation in a vehicle or the like. The power supply 2 is a lead storage battery or a lithium ion battery for example, and when the switch element 11 is on, the power supply 2 supplies power to the load 3, which is a headlight or a wiper motor for example, via the electrical wire 4, which is a wire harness for example. In the present embodiment, the wire temperature at the time of power supply from the power supply 2 to the load 3 is estimated by the microcomputer 14, and if the estimated wire temperature is greater than or equal to a threshold temperature (allowable temperature of the electrical wire), the supply of power to the load 3 is cut off by turning off the switch element 11.

The switch element 11 is an N-channel FET (Field Effect Transistor), for example. In the example shown in FIG. 1, a drain of the FET is connected to the power supply 2 via the electrical wire 4, and a source of the FET is connected to the load 3 via the electrical wire 4. Also, a gate of the FET is connected to the control circuit 15. The switch element 11 is provided at a midpoint in the electrical wire 4 that connects the power supply 2 and the load 3, and therefore power can be supplied from the power supply 2 to the load 3 if the switch element 11 is on, and the supply of power from the power supply 2 to the load 3 is cut off if the switch element 11 is off.

The current detection circuit 12 is a circuit for detecting the current value of current flowing in the electrical wire 4, and outputs an analog signal indicating the current value to the microcomputer. The current detection circuit 12 is connected to the microcomputer 14, and also connected to a fixed potential via a resistor 13, and outputs, to the resistor 13, a current that is a predetermined fraction (e.g., 1/4000) of the current flowing through the electrical wire 4. At this time, the analog value of the voltage input to the microcomputer 14 is expressed by the product of the value of current flowing in the resistor 13 and the resistance value of the resistor 13. Here, the resistance value is a constant, and therefore the value of the voltage input to the microcomputer 14 is proportional to the value of current that flows via the resistor 13. Also, the value of current flowing in the electrical wire 4 is a current value that is a predetermined multiple of the value of current output by the current detection circuit 12, and therefore a value obtained by dividing the value of the voltage input to the microcomputer 14 by the resistance value of the resistor 13 and then multiplying the result by the predetermined multiple is the current value of current flowing in the electrical wire 4.

The microcomputer 14 includes a control unit 141, a storage unit 142, and input unit 143, and an output unit 144. The control unit 141 includes a CPU (Central Processing Unit) and a ROM (Read Only Memory), for example. By executing a control program stored in advance in the ROM, the CPU of the control unit 141 realizes functions such as a function of estimating the wire temperature based on the current value of current flowing in the electrical wire 4, a function of comparing the estimated wire temperature with a temperature threshold value, and a function of determining, based on the comparison result, whether or not the switch element 11 needs to be turned on or off. The control unit 141 may also include a timer that counts the elapsed time from when a counting start instruction is received until a counting end instruction is received, a counter that performs counting, or the like (not shown).

The storage unit 142 is constituted by a memory such as an EEPROM (Electronically Erasable Programmable Read Only Memory), and stores data necessary for calculating the wire temperature from the current value of the electrical wire 4, data necessary for determining whether the switch element 11 is to be turned on or off, and the like. The reading of content stored in the storage unit 142 and the writing of content are performed by the control unit 141.

The input unit 143 includes an input terminal to which an analog signal is input, and an A/D conversion circuit (A: Analog, D: Digital) that converts an analog signal received via the input terminal into a digital signal. In the present embodiment, the input unit 143 is connected to the current detection circuit 12. An analog signal that indicates the current value of current flowing in the electrical wire 4 is input to the input unit 143 via the current detection circuit 12. The input unit 143 converts the analog signal received via the current detection circuit 12 into a digital signal with use of the A/D conversion circuit, and outputs the converted digital signal to the control unit 141.

The output unit 144 includes an interface for outputting the control signal output from the control unit 141 to the external control circuit 15. In the present embodiment, in the case of instructing the supply of power from the power supply 2 to the load 3, the control unit 141 outputs a control signal for turning on the switch element 11 to the control circuit 15 via the output unit 144. Also, in the case of cutting off the supply of power from the power supply 2 to the load 3, the control unit 141 outputs a control signal for turning off the switch element 11 to the control circuit 15 via the output unit 144.

The control circuit 15 is a circuit for turning on or off the switch element 11 in accordance with a control signal indicating a power supply instruction or a control signal indicating a cut-off instruction, which are output from the microcomputer 14. The control circuit 15 includes a comparator that compares an input voltage from the current detection circuit 12 and a reference voltage, and outputs a high level signal if the input voltage is lower than the reference voltage and outputs a low level signal if the input voltage is higher than or equal to the reference voltage, and an AND circuit that obtains the logical product of the control signal from the microcomputer 14 and the output signal from the comparator, for example. In this case, if the input voltage from the current detection circuit 12 is lower than the reference voltage, and the control signal indicating a power supply instruction (e.g., high level signal) is received from the microcomputer 14, the control circuit 15 outputs a high level signal so as to turn on the switch element 11, and if otherwise, outputs a low level signal so as to turn off the switch element 11.

Note that in the present embodiment, it is described that the microcomputer 14 estimates the wire temperature based on the current value of current flowing in the electrical wire 4, and outputs a control signal for turning on or off the switch element 11 based on the estimated wire temperature, but a configuration is possible in which the microcomputer 14 has a function of, when an operation signal instructing operation of the load 3 or a stop signal instructing the stopping of the load 3 is received from the outside, outputting a control signal for turning on or off the switch element 11 based on the received signal.

Also, the microcomputer 14 may have a function of determining whether or not the current flowing to the resistor 13 via the current detection circuit 12 is greater than or equal to threshold current, and immediately outputting a control signal for turning off the switch element 11 in the case of determining that the current is greater than or equal to the threshold current, that is to say in the case of determining that a current that exceeds the allowable range is flowing in the electrical wire. According to this function, it is possible to prevent overcurrent from flowing in the electrical wire 4.

The following describes a wire temperature estimation method.

The wire temperature of the electrical wire 4 rises as heat is generated in the electrical wire 4 when power is supplied from the power supply 2 to the load 3, and falls as heat is dissipated from the electrical wire 4 when the supply of power from the power supply 2 to the load 3 is cut off.

The wire temperature of the electrical wire 4 can be estimated by using the following expression to calculate a temperature difference ΔT relative to a reference temperature, for example.

$$\Delta T = \Delta Tp \times \exp(-\Delta t/\tau) + I^2 \times R \times r \times \{1 - \exp(-\Delta t/\tau)\} \quad \text{(Exp. 1)}$$

The terms in this expression are defined as follows:
ΔT: temperature difference relative to reference temperature of electrical wire 4 (° C.)
ΔTp: preceding temperature difference (° C.)
I: current value of current flowing through electrical wire 4 (A)
R: thermal resistance of electrical wire 4 (° C./W)
r: conductor resistance of electrical wire 4 (Ω)
Δt: sampling time (sec)
τ: heat dissipation time constant of electrical wire 4 (sec)

The first term on the right side of Expression 1 above indicates a temperature decrease that accompanies the dissipation of heat from the electrical wire 4 when the supply of power from the power supply 2 to the load 3 is stopped (i.e., when the current value I of current flowing in the electrical wire 4 is 0), and the second term on the right side indicates a temperature increase that accompanies generation of heat in the electrical wire 4 when power is supplied from the power supply 2 to the load 3.

Note that the environmental temperature (setting value) at the location where the power supply control device 1 is disposed may be used as the reference temperature. Also, a configuration is possible in which the temperature at the location where the power supply control device 1 is disposed is measured by a temperature sensor (not shown) such as a thermistor and input to the microcomputer 14, and the actual environmental temperature is used as the reference temperature.

The storage unit 142 included in the microcomputer 14 of the power supply control device 1 is assumed to store in advance the above-described calculation expression and data such as the conductor resistance, the thermal resistance, and the heat dissipation time constant of the electrical wire 4. The control unit 141 of the microcomputer 14 acquires the current value I of the electrical wire 4, which is obtained based on a signal input from the current detection circuit 12, at a predetermined time interval (sampling time Δt), and estimates the wire temperature of the electrical wire 4 (=reference temperature+ΔT) using the above-described Expression 1.

The control unit 141 determines whether the switch element 11 needs to be turned on or off by comparing the wire temperature estimated based on the current value I of the current flowing in the electrical wire 4 with an allowable temperature that has been set.

The following describes the allowable temperature that is set in the present embodiment.

Figure 2:
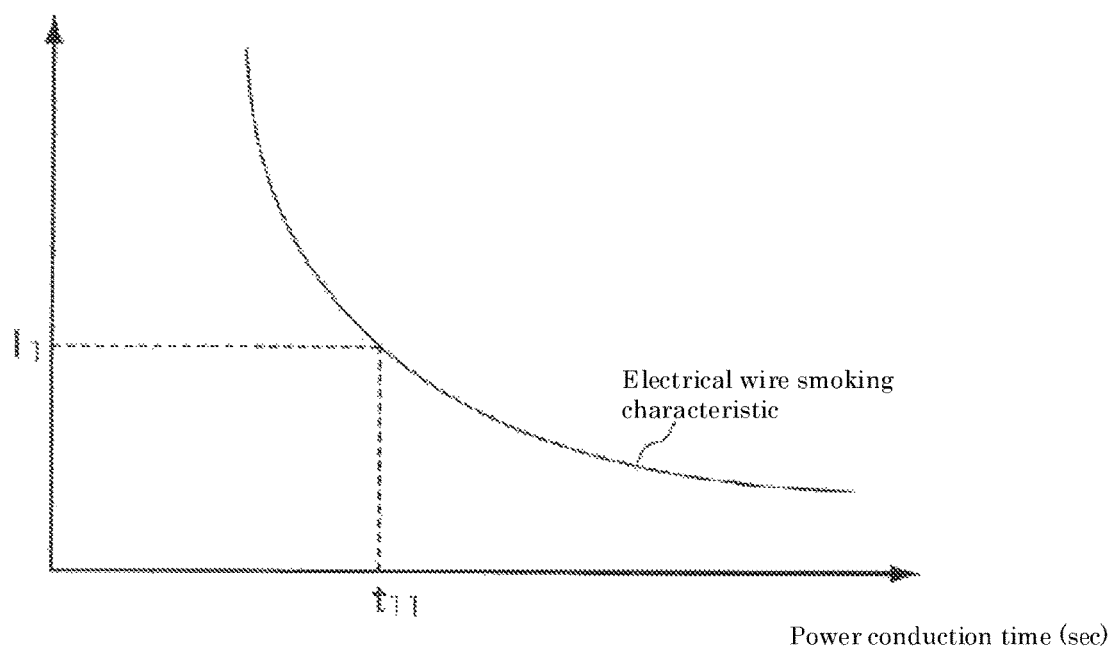
FIG. 2 is a graph showing a smoking characteristic of an electrical wire.

FIG. 2 is a graph showing a smoking characteristic of the electrical wire 4. In the graph shown in FIG. 2, the horizontal axis indicates the power conduction time (sec), and the vertical axis indicates the current value (A) of current flowing in the electrical wire 4. The curve shown by a solid line in FIG. 2 indicates the relationship between the current value of current flowing in the electrical wire 4 and the power conduction time required for the electrical wire 4 to start smoking (the smoking characteristic of electrical wire 4). For example, this line indicates that in the case where a current with a current value $I_1$ flows in the electrical wire 4, the electrical wire 4 starts to smoke at a power conduction time $t_{11}$.

According to the smoking characteristic shown in FIG. 2, it can be seen that if a current larger than the current value $I_1$ is flowing in the electrical wire 4, the electrical wire 4 starts to smoke at a power conduction time shorter than $t_{11}$, and if a current smaller than current value $I_1$ is flowing in the electrical wire 4, the electrical wire 4 starts to smoke at a power conduction time longer than $t_{11}$. Also, the smoking characteristic shown in FIG. 2 shows that if the current value of the current flowing in the electrical wire 4 is small to a certain extent, smoking will not occur regardless of the power conduction time.

Figure 3:
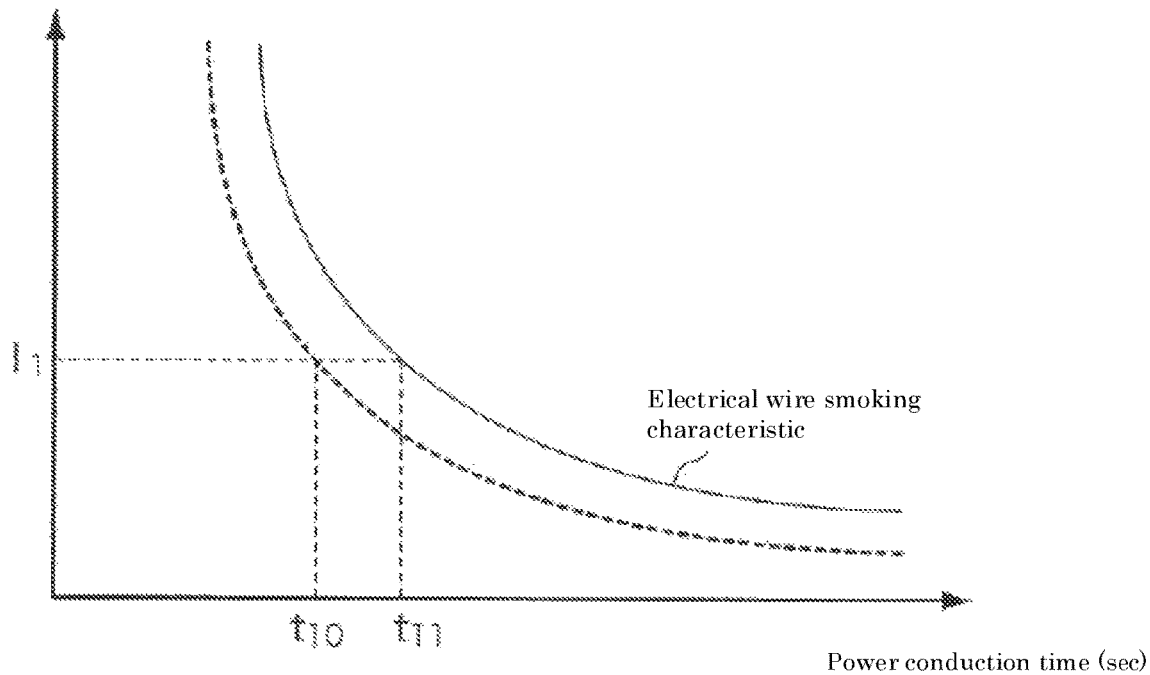
FIG. 3 is an illustrative diagram that illustrates a conventional allowable temperature setting technique.

FIG. 3 is an illustrative diagram that illustrates a conventional allowable temperature setting technique. If a current with the current value $I_1$ flows in the electrical wire 4, the electrical wire 4 does not smoke at a power conduction time $t_{10}$, which is shorter than $t_{11}$, and therefore the corresponding temperature can be set as the allowable temperature of the electrical wire 4. The same follows for the allowable temperature in the case where a current having a current value greater than (or smaller than) the current value $I_1$ flows in the electrical wire 4, and the temperatures of the electrical wire 4 that correspond to the curve indicated by a dashed line in FIG. 3 can be set as allowable temperatures, for example.

In this way, conventionally, the allowable temperature (threshold value) of the electrical wire 4 has been set with consideration given to only the smoking characteristic of the electrical wire 4. In other words, in a conventional power supply control device, a wire temperature estimated based on the current value of current flowing in the electrical wire is compared with an allowable temperature (threshold value) set based only on the smoking characteristic of the electrical wire, power supply is stopped if the estimated wire temperature is greater than or equal to the threshold value, and power supply is continued if the estimated wire temperature is less than the threshold value.

However, in the conventional technique, no consideration whatsoever is given to the smoking characteristic of the switch element. The switch element and the electrical wire have different thermal characteristics (heat generation characteristic and heat dissipation characteristic), and therefore even if the switch element is switched on/off in accordance with an allowable temperature that is set based on only the smoking characteristic of the electrical wire, there is a possibility of not being able to protect the switch element if a relatively large current flows therein.

Figure 4:
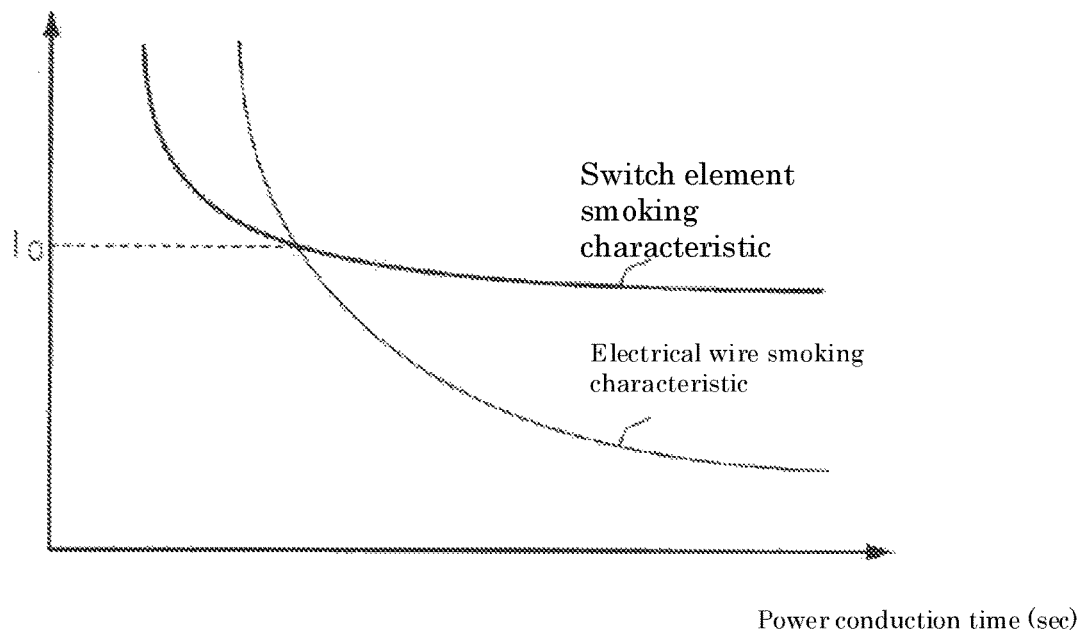
FIG. 4 is a graph showing smoking characteristics of the electrical wire and a switch element.

FIG. 4 is a graph showing smoking characteristics of the electrical wire 4 and the switch element 11. In the graph shown in FIG. 4, the horizontal axis indicates the power conduction time (sec), and the vertical axis indicates the current value (A) of current flowing in the electrical wire 4. The curve shown by a thin solid line in FIG. 4 indicates the relationship between the current value of current flowing in the electrical wire 4 and the power conduction time required for the electrical wire 4 to smoke (the smoking characteristic of electrical wire 4). On the other hand, the curve shown by a thick solid line in FIG. 4 indicates the relationship between the current value of current flowing in the electrical wire 4 and the power conduction time required for the switch element 11 to smoke (the smoking characteristic of switch element 11).

It can be understood from the graph shown in FIG. 4 that if the current flowing in the electrical wire 4 is relatively large (is larger than a current value $I_0$ that corresponds to the intersection of the two smoking characteristics), the switch element 11 starts to smoke in a shorter time than the electrical wire 4. For this reason, even if the switch element 11 is switched on/off according to an allowable temperature set based on only the smoking characteristic of the electrical wire 4, in the case where a current larger than $I_0$ is applied, there is a possibility that the switch element 11 will smoke or ignite first, and there is a possibility that the switch element 11 cannot be protected.

In view of this, in the present embodiment, the allowable temperature (threshold value) of the electrical wire 4 is set with consideration given to both the smoking characteristic of the electrical wire 4 and the smoking characteristic of the switch element 11.

Figure 5:
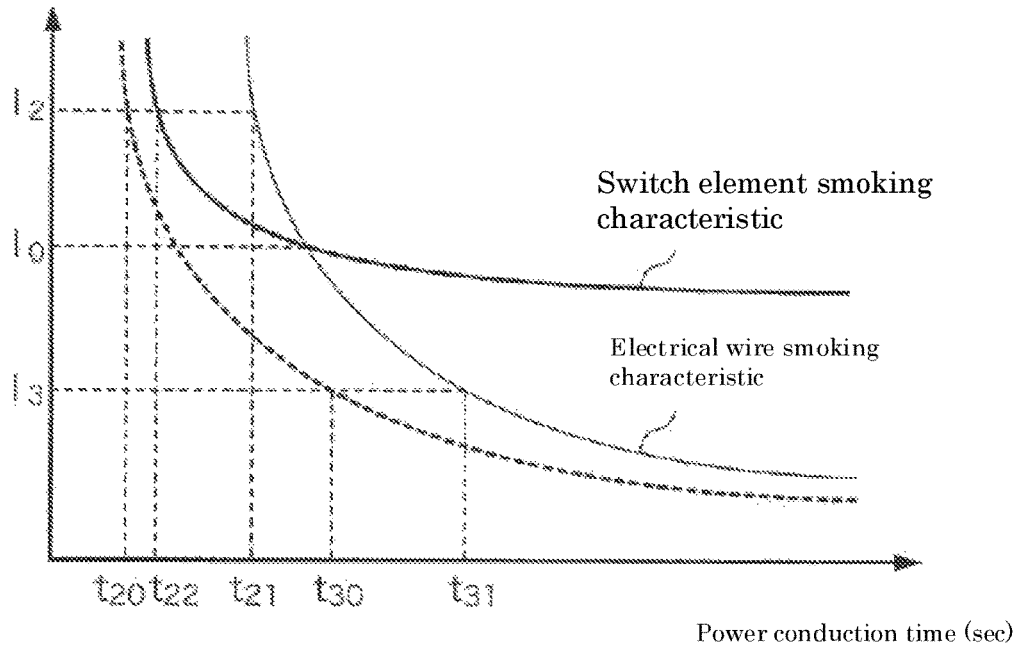
FIG. 5 is an illustrative diagram that illustrates an allowable temperature setting technique of the embodiment.

FIG. 5 is an illustrative diagram that illustrates an allowable temperature setting technique of the present embodiment. It is assumed that if a current with a current value $I_2$ ($I_2>I_0$) flows in the electrical wire 4, the electrical wire 4 starts to smoke at a power conduction time $t_{21}$, and the switch element starts to smoke at a power conduction time $t_{22}$. At this time, at a power conduction time $t_{20}$, which is shorter than $t_{21}$ and $t_{22}$, neither the electrical wire 4 nor the switch element 11 start to smoke, and therefore the corresponding temperature can be set as the allowable temperature of the electrical wire 4.

In the present embodiment, a virtual electrical wire having a smoking characteristic that satisfies the smoking characteristics of both the switch element 11 and the electrical wire 4 is envisioned as shown by the dashed line in FIG. 5. Specifically, a virtual electrical wire having a heat dissipation time constant $\tau-\Delta\tau$ ($\Delta T$ being a positive constant), which is smaller than the heat dissipation time constant $\tau$ of the electrical wire 4 used in actual power supply, is envisioned, and an allowable temperature is set so as to satisfy the smoking characteristic of this virtual electrical wire. In other words, the allowable temperature that is set in this way indicates the smoking temperature of the switch element 11 estimated by changing the heat dissipation time constant $\tau$ in the electrical wire 4 temperature calculation to a smaller value ($\tau-\Delta\tau$).

The wire temperature of the virtual electrical wire having the heat dissipation time constant $\tau-\Delta\tau$ is estimated using the temperature difference from the reference temperature, for example.

$$\Delta T = \Delta Tp \times \exp(-\Delta t/(\tau-\Delta\tau)) + I^2 \times R \times r \times \{1-\exp(\Delta t/(\tau-\Delta\tau))\} \quad \text{(Exp. 2)}$$

Accordingly, the allowable temperature can be set by substituting the current value $I_2$ and the power conduction time $t_{20}$ into Expression 2. The same follows for the allowable temperature in the case where a current having a current value larger than (or smaller than) that current value $I_2$ is applied, and by using Expression 2 to obtain the temperature of the virtual electrical wire that corresponds to the curve indicated by the dashed line in FIG. 5, it is possible to set allowable temperatures that correspond to various current values.

Data indicating the calculated allowable temperature is stored in the storage unit 142 as a threshold value with respect to the wire temperature of the electrical wire 4 estimated by the control unit 141. The control unit 141 compares the wire temperature estimated based on the current value of current flowing in the electrical wire 4 with the allowable temperature stored in the storage unit 142, and if the estimated wire temperature is greater than or equal to the allowable temperature, outputs a control signal for stopping power supply to the control circuit 15 via the output unit 144. Also, if the estimated wire temperature is less than the allowable temperature, the control unit 141 outputs a control signal instructing power supply to the control circuit 15 via the output unit 144.

As a result, with the power supply control device 1 according to the present embodiment, if the current value of current flowing in the electrical wire 4 is $I_2$ ($>I_0$) shown in FIG. 5, the switch element 11 can be turned off at the power conduction time $t_{20}$, which is reached before the power conduction time $t_{22}$, thus making it possible to prevent the switch element 11 from smoking or igniting. Also, if the current value of current flowing in the electrical wire 4 is $I_3$ ($<I_0$) shown in FIG. 5, the switch element 11 can be turned off at the power conduction time $t_{30}$, which is reached before the power conduction time $t_{31}$, thus making it possible to prevent the electrical wire 4 from smoking or igniting.

The following describes a procedure of processing executed by the control unit 141.

Figure 6:
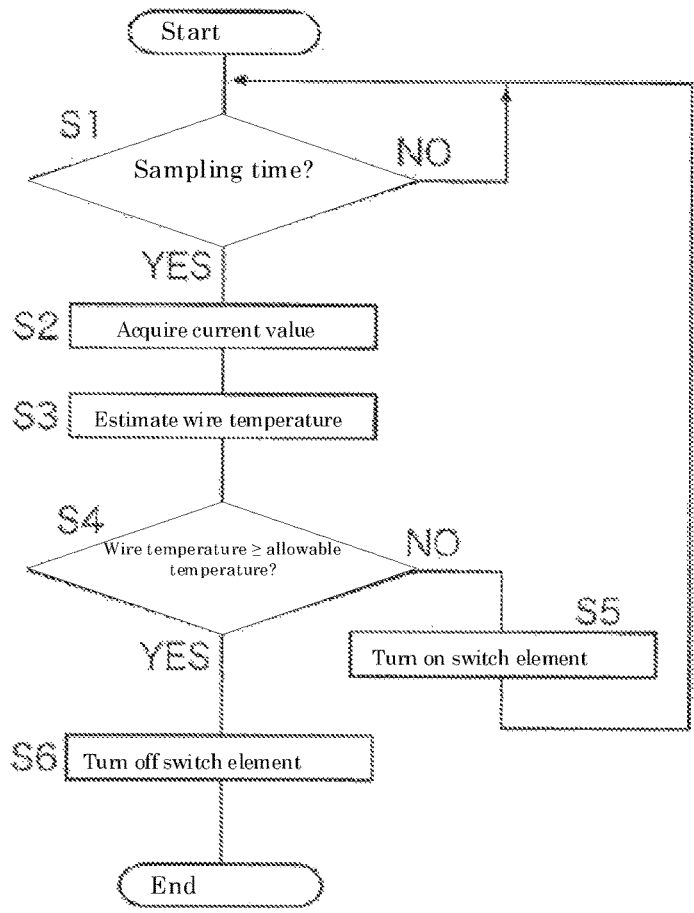
FIG. 6 is a flowchart illustrating a procedure of processing executed by a control unit.

FIG. 6 is a flowchart that illustrates a procedure of processing executed by the control unit 141. The control unit 141 references an internal timer and determines whether or not the current time is the sampling time (step S1). If the current time is not the sampling time (S1: NO), the control unit 141 waits until the sampling time is reached.

Upon determining that the current time is the sampling time (S1: YES), the control unit 141 acquires the current value of current flowing in the electrical wire 4 based on an output signal that is from the current detection circuit 12 and was input via the input unit 143 (step S2).

Next, the control unit 141 estimates the wire temperature by substituting the sampling time and the current value of current flowing in the electrical wire 4 into Expression 1 (step S3).

The control unit 141 compares the wire temperature estimated in step S3 with an allowable temperature that has been set so as to satisfy both the smoking characteristic of the electrical wire 4 and the smoking characteristic of the switch element 11, and determines whether or not the wire temperature is greater than or equal to the allowable temperature (step S4).

In the case of determining that the estimated wire temperature is less than the allowable temperature (S4: NO), the control unit 141 outputs the control signal for turning on the switch element 11 to the control circuit 15 via the output unit 144, and maintains the switch element 11 in the on state (step S5). In the case of maintaining the switch element 11 in the on state, the supply of power from the power supply 2 to the load 3 is maintained. After outputting the control signal for turning on the switch element 11, the control unit 141 returns the processing to step S1.

On the other hand, in the case of determining that the estimated wire temperature is greater than or equal to the allowable temperature (S4: YES), the control unit 141 outputs a control signal for turning off the switch element 11 to the control circuit 15 via the output unit 144, in order to cut off the supply of power from the power supply 2 (step S6). At this time, the control circuit 15 switches off the switch element 11, and therefore the supply of power from the power supply 2 to the load 3 is cut off. After outputting the control signal for turning off the switch element 11, the control unit 141 ends the processing performed according to this flowchart.

As described above, in the present embodiment, an allowable temperature set so as to satisfy both the smoking characteristic of the electrical wire 4 and the smoking characteristic of the switch element 11 is compared with a wire temperature that is estimated based on the current value of current flowing in the electrical wire 4, and if the wire temperature is greater than or equal to the allowable temperature, the switch element 11 is turned off so as to cut off the supply of power from the power supply 2 to the load 3, and therefore even if a relatively large current flows in the electrical wire 4, the switch element 11 can be prevented from smoking and igniting, and moreover, even if a relatively small current flows in the electrical wire 4 for a long period of time, the electrical wire 4 can be prevented from smoking and igniting.

The embodiment disclosed here is to be considered in all respects as illustrative and not limiting. The scope of the present invention is indicated by the claims rather than by the foregoing description, and all changes which come within the meaning and range of equivalency of the claims are intended to be embraced therein.

LIST OF REFERENCE NUMERALS

1 Power supply control device
2 Power supply
3 Load
4 Electrical wire
11 Switch element
12 Current detection circuit
13 Resistor
14 Microcomputer
15 Control circuit
141 Control unit
142 Storage unit
143 Input unit
144 Output unit

The invention claimed is:

1. A power supply control device comprising:
a switch element provided at a midpoint in an electrical wire that connects a power supply and a load;
a current detection unit that detects a current value of a current flowing in the electrical wire;
a temperature estimation unit that estimates a wire temperature of the electrical wire based on the current value detected by the current detection unit and a heat dissipation time constant of the electrical wire; and
a control unit that performs control to turn on or off the switch element based on the wire temperature estimated by the temperature estimation unit;
wherein the control unit calculates a threshold temperature that is lower than both a temperature indicated by a smoking characteristic of the switch element and a temperature indicated by a smoking characteristic of the electrical wire, wherein the threshold temperature is calculated by changing the heat dissipation time constant of the electrical wire used to estimate the wire temperature to a smaller value; and
the control unit performs control to turn off the switch element if the wire temperature estimated by the temperature estimation unit is greater than or equal to the threshold temperature.

2. The power supply control device according to claim 1, wherein the temperature estimation unit estimates the wire temperature of the electrical wire based on a thermal resistance, a conductor resistance, the heat dissipation time constant, and the current value of the electrical wire.

3. The power supply control device according to claim 1, wherein the threshold temperature is a temperature indicated by a smoking characteristic of a virtual electrical wire that has a heat dissipation time constant smaller than the heat dissipation time constant of the electrical wire and that satisfies the smoking characteristic of the switch element.

* * * * *